United States Patent
Sun et al.

(10) Patent No.: US 10,697,826 B2
(45) Date of Patent: Jun. 30, 2020

(54) MAGNETIC FIELD BASED MICRO-VIBRATION MEASUREMENT DEVICE AND MEASURING METHOD THEREOF

(71) Applicant: INSTITUTE OF GEOLOGY AND GEOPHYSICS CHINESE ACADEMY OF SCIENCES (IGGCAS), Beijing (CN)

(72) Inventors: Shuquan Sun, Beijing (CN); Aimin Du, Beijing (CN); Lin Zhao, Beijing (CN); Heng Tang, Beijing (CN); Qiong Li, Beijing (CN); Xiao Feng, Beijing (CN); Cuihong Li, Beijing (CN); Qingyun Di, Beijing (CN)

(73) Assignee: INSTITUTE OF GEOLOGY AND GEOPHYSICS CHINESE ACADEMY OF SCIENCES (IGGCAS), Beijing (CN)

( * ) Notice: Subject to any disclaimer, the term of this patent is extended or adjusted under 35 U.S.C. 154(b) by 260 days.

(21) Appl. No.: 15/910,328

(22) Filed: Mar. 2, 2018

(65) Prior Publication Data
US 2018/0195895 A1  Jul. 12, 2018

Related U.S. Application Data

(63) Continuation of application No. PCT/CN2015/090067, filed on Sep. 21, 2015.

(30) Foreign Application Priority Data

Sep. 7, 2015 (CN) ........................ 2015 1 0564807

(51) Int. Cl.
*G01H 11/02* (2006.01)
*G01R 33/00* (2006.01)
(Continued)

(52) U.S. Cl.
CPC ............ *G01H 11/02* (2013.01); *G01D 5/125* (2013.01); *G01R 33/0029* (2013.01);
(Continued)

(58) Field of Classification Search
CPC .................................. G01H 11/02; G01D 5/02
See application file for complete search history.

(56) References Cited

U.S. PATENT DOCUMENTS

2006/0119353 A1  6/2006 Nakano et al.
2008/0231443 A1* 9/2008 Kotter .................... G08B 13/24
340/551
(Continued)

FOREIGN PATENT DOCUMENTS

CN    1704715 A   12/2005
CN  101216324 A    7/2008
(Continued)

*Primary Examiner* — Christopher E Mahoney
(74) *Attorney, Agent, or Firm* — Hemisphere Law, PLLC; Zhigang Ma

(57) ABSTRACT

A magnetic field based micro-vibration measurement device and a measuring therefore are provided, which are applied in a micro-vibration measurement technical field. Fluxgate sensors and a control processing circuit are included. Each of the fluxgate sensors is disposed with an excitation coil and an induction coil that are mutually corresponding; the control processing circuit includes: an excitation signal generating module, a frequency-selective amplifying module, a phase-sensitive rectifying module, a smooth filtering module an ambient magnetic field acquisition module, and a vibration data statistics module. Excitation coils generate excitation magnetic field signals according to the excitation signal sent from the excitation signal generating module the induction coils are for generating induced current signals according to the receive excitation magnetic field signal and the ambient magnetic field signal. Induced current signals are (Continued)

calculated to obtain ambient magnetic field data after sequentially undergoing selective amplification, rectification and smooth filtering.

14 Claims, 4 Drawing Sheets

(51) Int. Cl.
*G01R 33/04* (2006.01)
*G01D 5/12* (2006.01)
*G01R 33/032* (2006.01)

(52) U.S. Cl.
CPC ..... *G01R 33/0041* (2013.01); *G01R 33/0322* (2013.01); *G01R 33/04* (2013.01)

(56) References Cited

U.S. PATENT DOCUMENTS

2015/0048820 A1\* 2/2015 Schaffer ................ G01R 33/04
324/253
2016/0084925 A1\* 3/2016 Le Prado ........... A61B 5/04007
324/301

FOREIGN PATENT DOCUMENTS

CN  103364073  10/2013
JP  2004239799 A  8/2004

\* cited by examiner

MAGNETIC FIELD BASED MICRO-VIBRATION MEASUREMENT DEVICE AND MEASURING METHOD THEREOF

FIELD OF THE DISCLOSURE

The disclosure relates to a micro-vibration measurement technical field, and more particularly to a magnetic field based micro-vibration measurement device and a magnetic field based micro-vibration measuring method.

BACKGROUND

In current society, vibration measuring instruments have been widely applied in each aspect of social production, which can be configured for measuring velocity, acceleration and displacement of vibration. But most vibration measuring instruments available on the market are bearing structures, and the measured vibration signal includes the vibration of workpieces. The vibration of workpieces is the primary source to generate noises. The vibration noise of bearings comprehensively reflects dynamic properties and quality levels of bearings. The accuracy of the conventional vibration measuring instruments is relatively low. But in the manufacturing industry, the aerospace industry as well as the national defense and military industry, the request for precision and ultra precision processing measurements is more and more urgent, but the conventional technical level can hardly meet the requirement on high accuracy and highly stable platform.

SUMMARY

Aiming at the problems above, the objective of the disclosure is to provide a magnetic field based micro-vibration measurement device, including a number of fluxgate sensors and a control processing circuit.

Each of the fluxgate sensors is disposed with an excitation coil and an induction coil that are mutually corresponding.

The control processing circuit includes: an excitation signal generating module, a frequency-selective amplifying module, a phase-sensitive rectifying module, a smooth filtering module, an ambient magnetic field acquisition module, and a vibration data statistics module.

The excitation signal generating module is configured for generating an excitation signal.

The excitation coil of each of in the fluxgate sensors is connected to the excitation signal generating module and configured for generating an excitation magnetic field signal according to the received excitation signal.

The induction coil is configured for receiving a mixed magnetic field signal and generating an induced current signal according to the mixed magnetic field signal. The mixed magnetic field signal is formed by mixing the excitation magnetic field signal generated by the corresponding excitation coil with an external ambient magnetic field signal.

The frequency-selective amplifying module is connected with the induction coil, configured for performing a frequency-selective amplification on the received induced current signal to obtain a secondary harmonic signal of the induced current signal.

The phase-sensitive rectifying module is connected with the frequency-selective amplifying module and configured for performing a rectification processing and a signal reversal on the secondary harmonic signal.

The smooth filtering module is connected with the phase-sensitive rectifying module and configured for performing a smooth filtering on the secondary harmonic signal after the signal reversal to obtain a direct current signal.

The ambient magnetic field acquisition module is connected with the smooth filtering module and configured for multiplying the direct current signal by a predetermined calibration coefficient to obtain ambient magnetic field data.

The vibration data statistics module is connected with the ambient magnetic field acquisition module and configured for receiving the ambient magnetic field data corresponding to all the fluxgate sensors, obtaining a micro-vibration data segment in each segment of the ambient magnetic field data by a wavelet analysis, comparing two micro-vibration data segments in an identical time period to obtain a magnetic field difference between two micro-vibration data segments, and calculating a micro-vibration angle between corresponding two of the fluxgate sensors according to the magnetic field difference.

Furthermore, the control processing circuit is disposed with a feedback regulation module. The feedback regulation module is connected with the smooth filtering module and the induction coils and configured for subtracting the direct current signal in the smooth filtering module from the induced current signal generated by the induction coil to obtain a signal difference and performing a negative feedback regulation on the induced current signal generated by the induction coil according to the signal difference.

Furthermore, a power amplifying module and a resonant module are sequentially connected between the excitation signal generating module and the excitation coils.

The power amplifying module is connected with the excitation signal generating module and configured for amplifying a power of the excitation signal.

The resonant module is connected with the power amplifying module and the excitation coils individually and configured for resonating, the excitation signal after the power has been amplified and sending the excitation signal after the resonating to the excitation coils.

Furthermore, the disclosure further includes: a data output nodule. The data output module is connected with the vibration data statistics module. The data output module is configured for outputting data. The magnetic field based micro-vibration measurement device further includes a display screen. The display screen is configured for displaying the micro-vibration angle.

Furthermore, the excitation coil includes two orthonormal coils or three mutual orthonormal coils. The induction coil includes three groups of coils.

A magnetic field based micro-vibration measuring method of the disclosure includes generating an excitation signal, transmitting the excitation signal to a number of fluxgate sensors, and generating excitation magnetic, field signals respectively by excitation coils of the fluxgate sensors according to received excitation signals, receiving the excitation magnetic field signal generated by the excitation coil and an external ambient magnetic field signal by an induction coil which is in, a same one of the fluxgate sensors as the excitation coil, and generating an induced current signal according to a mixed magnetic field signal formed by the excitation magnetic field signal and the ambient magnetic field signal, performing a frequency-selective amplification on the induced current signal to obtain a secondary harmonic signal of the induced current signal, performing a rectification processing and a signal reversal on the secondary harmonic signal, and performing smooth filtering after the signal reversal to obtain a direct current signal, multiplying the direct current signal by a predetermined calibration coefficient to obtain ambient magnetic field data of each of the fluxgate sensors, obtaining a micro-vibration data segment in each segment of the ambient magnetic data by a wavelet analysis, comparing micro-vibration data segments in a same time period of two of the fluxgate sensors to obtain a magnetic field difference between two micro-vibration data segments, and calculating a micro-vibration angle between the two of the fluxgate sensors according to the magnetic field difference.

Furthermore, after performing a rectification processing and a signal reversal on the secondary harmonic signal, and performing smooth filtering after the signal reversal to obtain the direct current signal, the measuring method includes: subtracting the direct current signal from the induced current signal to obtain a signal difference, and performing a negative feedback regulation on a magnitude of the induced current signal according to the signal difference.

Furthermore, performing a negative feedback regulation on a magnitude of the induced current signal according to the signal, difference includes: judging whether the signal difference is positive or negative; if the signal difference is negative, correspondingly increasing the induced current signal; if the signal difference is positive, and correspondingly decreasing the induced current signal until the signal difference is equal to zero.

Furthermore, after generating the excitation signal, the measuring method includes: amplifying a power of the excitation signal, resonating the excitation signal after amplifying the power, and sending the resonated excitation signal to the excitation coils.

Furthermore, before generating the excitation signal, the measuring method includes: securing the fluxgate sensors with an object to be measured.

Furthermore, after calculating a micro-vibration angle between the two of the fluxgate sensors according to the magnetic field difference, the measuring method includes: displaying the micro-vibration angle.

Furthermore, calculating a micro-vibration angle between the two of the fluxgate sensors according to the magnetic field difference includes: multiplying the magnetic field difference by a predetermined direct proportional function to obtain the micro-vibration angle between two corresponding fluxgate sensors.

Furthermore, the excitation signals are rectangular wave signals.

Furthermore, the fluxgate sensors are spaced apart from each other.

The disclosure utilizes the fluxgate magnetometer to measure the magnetic field variation generated by the vibration, which can completely eliminate the noise brought in by the vibration of the measurement workpiece itself, and the signal obtained by measurement can be more accurate for easier analysis; and the fluxgate magnetometer measures the variation of the magnetic fields to obtain the corresponding vibration parameters, which does not require to generate physical quantities by itself, and the physical quantities are achieved by directly measuring the magnetic field on the earth. The processing method is not only highly precise, and the measured data has the better quality.

Figure 4:
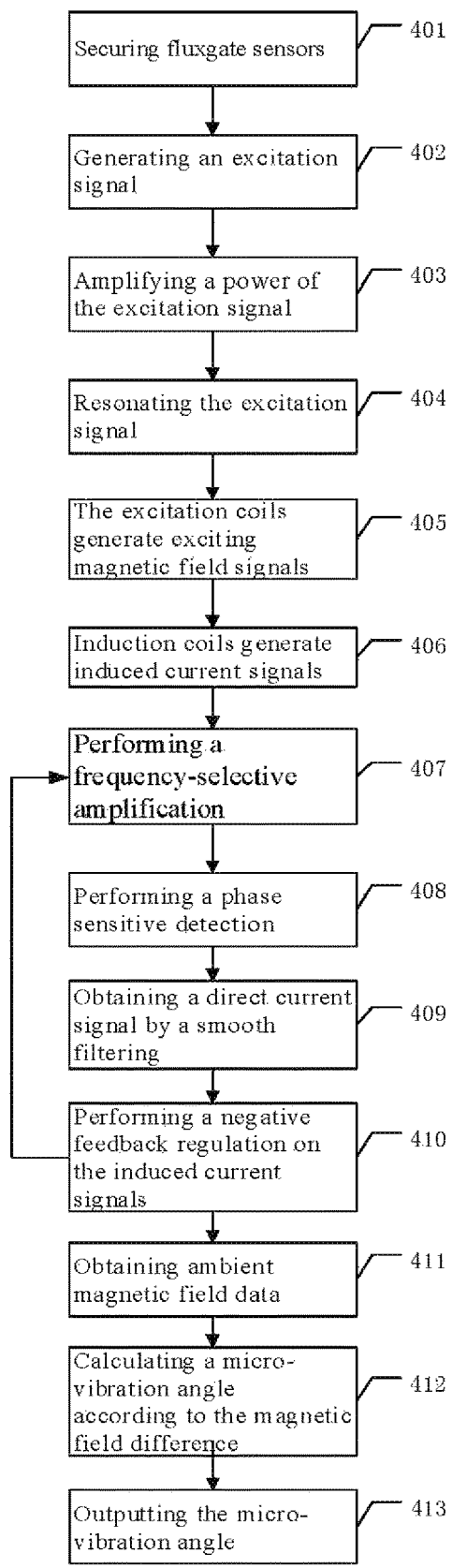
Figure 5:
Figure 6:
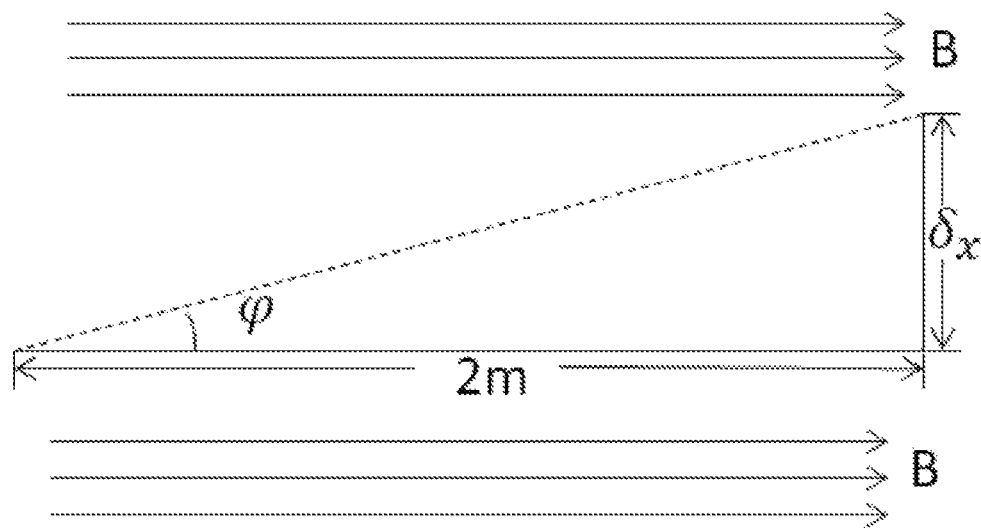

FIG. is an operational flowchart of a measuring method, in an embodiment of the disclosure;

FIG. 4 is an operational flowchart of a measuring method in another embodiment of the disclosure;

FIG. 5 is a schematic view of a data result of micro-vibration measurement of the disclosure;

FIG. 6 is a principal schematic view to calculate a micro-vibration angle in an embodiment of the disclosure.

DETAILED DESCRIPTION OF PREFERRED EMBODIMENTS

The disclosure will be further illustrated in detail with reference to concrete embodiments and accompanying drawings as follows.

Figure 1:
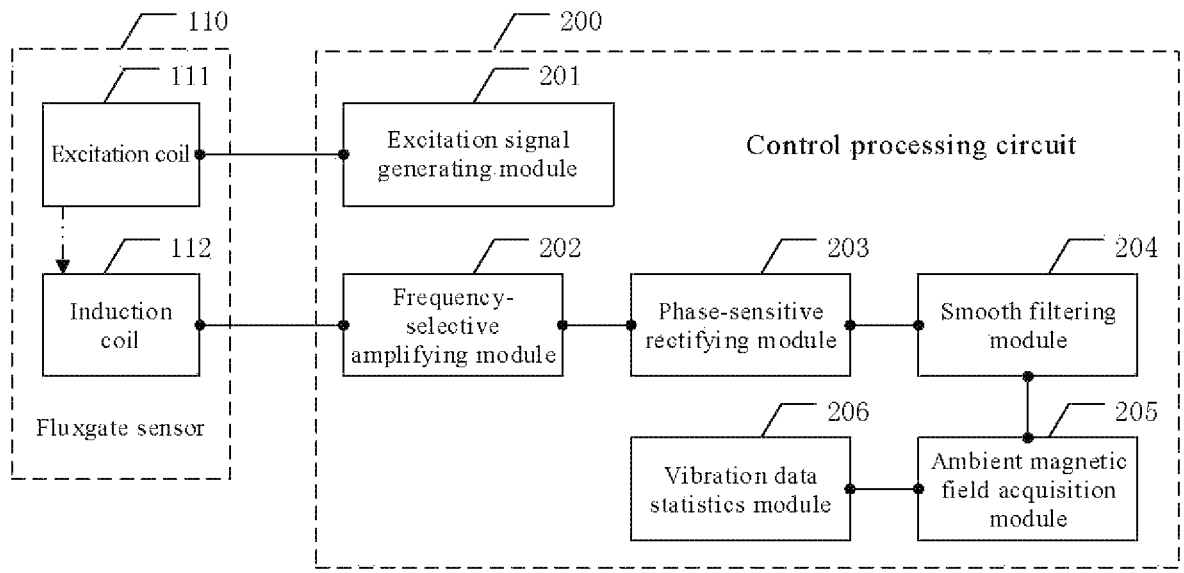
FIG. 1 is a logic structural view of a measurement device in an embodiment of the disclosure.
Figure 2:
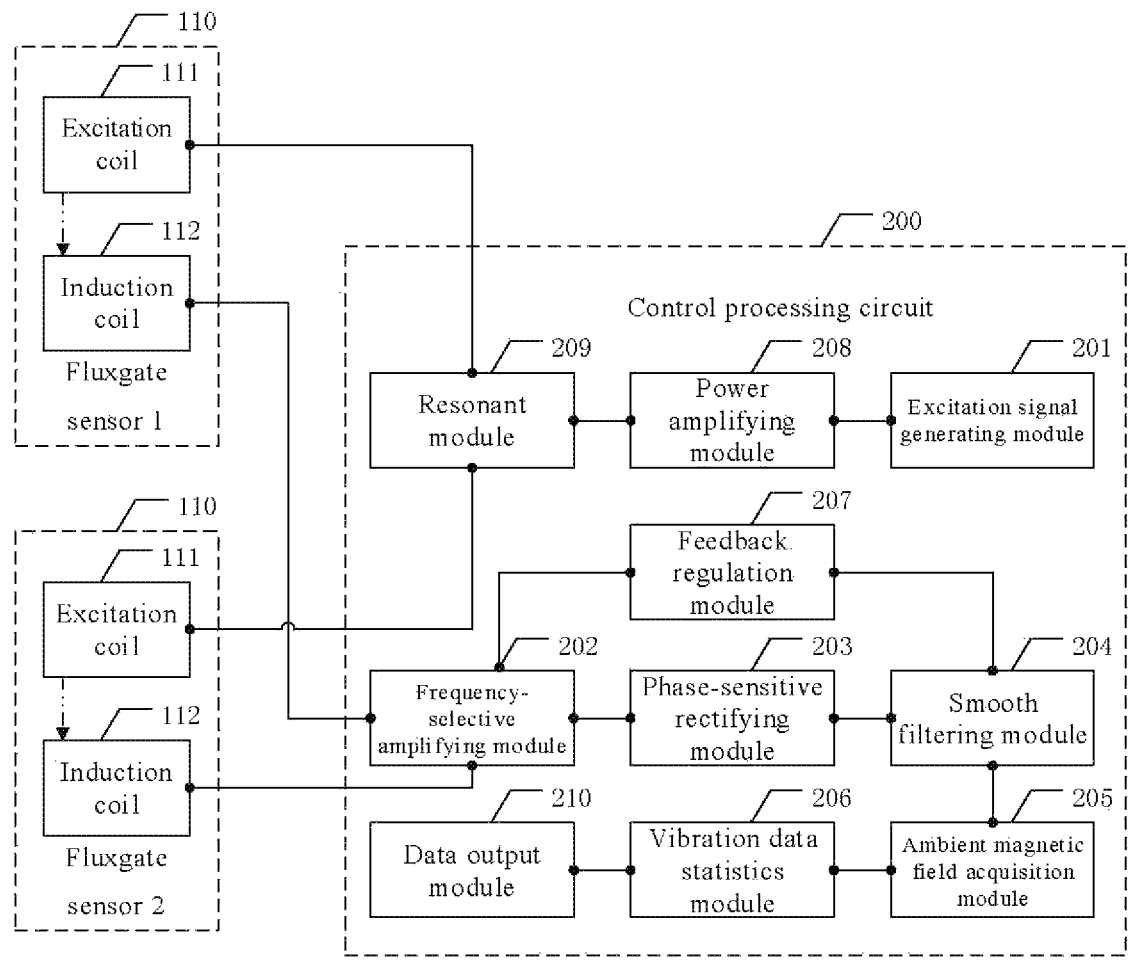
FIG. 2 is a logic structural view of a measurement device in another embodiment of the disclosure.

Referring to FIG. 1 and FIG. 2, an embodiment of the disclosure provides a magnetic, field based micro-vibration measurement device, including: two or more than two fluxgate sensors 110 and a control processing circuit 200.

Each of the fluxgate sensors 110 is disposed with an excitation coil 111 and an induction coil 112 that are mutually corresponding. The fluxgate principle is a magnetic field detection principle utilizing the Faraday law of electromagnetic induction combined with features of magnetism conductive materials. The fundamental working procedure of the fluxgate magnetometer is utilizing a driving circuit to provide an excitation signal of the alternating current to the excitation coils 111, and magnetic fields are generated due to the current variation. Magnetic fields in the spiral loop are mutually neutralized. In a situation of external magnetic field existed and high magnetism conductive materials saturated, the internal magnetic field suffers a corresponding alternating variation, and the alternating variation magnetic field generates an alternating electric field on signal coils. According to the theoretical deduction, an excitation signal whose frequency is f generates an induced signal of 2f on the induction coil 112.

The control processing circuit 200 includes: an excitation signal generating module 201 (referred to as an excitation signal generator), a frequency-selective amplifying module 202 (referred to as a frequency-selective amplifier), a phase-sensitive rectifying module 203 (referred to as a phase-sensitive rectifier), a smooth filtering module 204 (referred to as a smooth filter), an ambient magnetic field acquisition module 205 (referred to as an ambient magnetic field acquisition device), and a vibration data statistics module 206 (referred as to a vibration data statistics device).

The excitation signal generating module 201 is configured for generating an excitation signal.

The excitation coil 111 in each of the fluxgate sensors 110 is connected to the excitation signal generating module 201, configured for generating an excitation magnetic field signal according to the received excitation signal.

The induction coils 112 are configured for receiving mixed magnetic, field signals, and generating an induced current signal according to the mixed magnetic field signals. The mixed magnetic field signals are formed by mixing the excitation magnetic field signal generated by the corresponding excitation coil 111 and an external ambient magnetic field signal.

The frequency-selective amplifying module 202 is connected with the induction coils 112, configured for selectively amplifying the received induced current signal to obtain a secondary harmonic signal of the induced current signal.

The phase-sensitive rectifying module 203 is connected with the frequency-selective amplifying module 202, configured for rectifying the secondary harmonic signal, and processing a signal reversal.

The smooth filtering module 204 is connected with the phase-sensitive rectifying module 203, configured for smoothly filtering the secondary harmonic signal after the signal reversal to obtain a direct current signal.

The ambient magnetic field acquisition module 205 is connected with the smooth filtering module 204, configured for multiplying the direct current signal by a predetermined calibration coefficient to obtain ambient magnetic field data.

The vibration data statistics module 206 is connected with the ambient magnetic field acquisition module 205, configured for receiving the ambient magnetic field data corresponding to all the fluxgate sensors 110, achieving a micro-vibration data segment in each section of the ambient magnetic field data by a wavelet analysis. The wavelet analysis is varying the ambient magnetic field data by wavelets to obtain a two-dimensional wavelet spectrum. The amplitude with the relatively larger correlation coefficient in the same frequency section in the wavelet spectrum can be default to be the variation of large gradient in the environment, instead of the influence generated by micro-vibration of the vector itself. The position of multiple wavelets with the relatively large variation of amplitudes in the same frequency section, and comparing two micro-vibration data segments in an identical time period to obtain a magnetic field difference between two micro-vibration data segments. As the magnetic field difference is directional proportional to the micro-vibration angle, the micro-vibration angle between two corresponding fluxgate sensors 110 is consequently obtained by calculating the magnetic field difference.

As the precision of the fluxgate sensors can be up to 0.01 nT, if the geomagnetic field 30000 nT can act as a background magnetic field, the calculated micro-vibration measuring data can reach the order of magnitude in nm, which is three dimensional vibration data with XYZ three axes components, and the measuring precision is extremely high. The larger the ambient magnetic field, the higher the measuring precision is.

Furthermore, the control processing circuit 200 is disposed with a feedback regulation module 207 (referred as to a feedback regulator). The feedback regulation module 207 is connected with the smooth filtering module 204 and the frequency-selective amplifying module 202, configured for subtracting the induced current signal generated by the induction coils 112 from the direct current signal in the smooth filtering module 204 to obtain a signal difference, and the induced current signal generated by the induction coils 112 are processed by a negative feedback regulation according to the signal difference. The signal difference is continuously reduced by regulation of the feedback regulation module 207. The system tends to be stable while the difference is smaller.

Furthermore, a power amplifying module 208 (referred as to a power amplifier) and a resonant module 209 (referred as to a resonator) are sequentially connected between the excitation signal generating module 201 and the excitation coils 111.

The power amplifying module 208 is connected with the excitation signal generating module 201, configured for amplifying a power of the excitation signal; as the power of excitation signal output by the excitation signal generating module 201 is limited, which cannot sufficiently drive the excitation coils 111. After the excitation signals go through the power amplifying module 208, the power of the excitation signals is amplified for better driving the excitation coils 111.

The resonant module 209 is connected with the power amplifying module 208 and the excitation coils 111, configured for resonating the excitation signal after the power has been amplified, and sending the excitation signal after resonating to the excitation coils 111; the resonating treatment can further guarantee the signal intensity of the excitation signal.

Furthermore, the disclosure further includes: a data output module 210 (referred as to a data output device). The data output module 210 is connected with the vibration data statistics module 206. The data output module 210 is configured for outputting data. The micro-vibration measurement device based on a magnetic field further includes a display screen. The display screen is configured for displaying the micro-vibration angle.

Furthermore, the excitation coil 111 consists of two orthonormal coils or three mutual orthonormal coils. The induction coil 112 includes three groups of coils.

Figure 3:
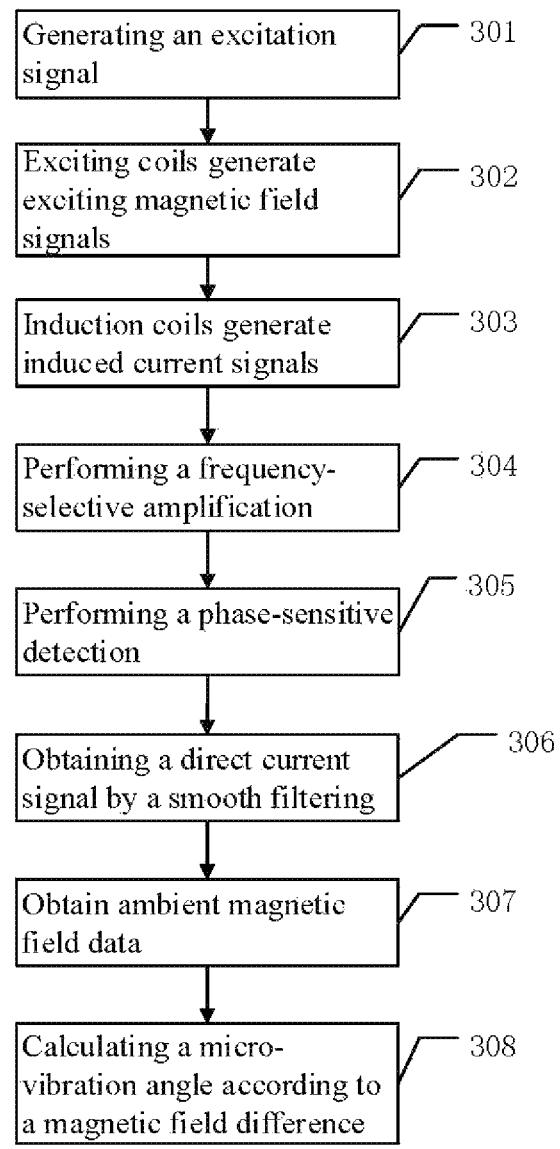

Referring to FIG. 3, the disclosure further provides a magnetic field based micro-vibration measuring method, including following steps.

301, excitation signals are generated.

The excitation signal generating module outputs excitation signals by programming.

302, excitation coils generate excitation magnetic field signals.

The excitation signals are transported to the fluxgate sensors. Each of the excitation coils in the fluxgate sensors generates the excitation magnetic field signal according to the received excitation signals.

303, induction coils generate induced current signals.

The induction coils in the fluxgate sensors receive the excitation magnetic field signals generated by the excitation signals in an identical fluxgate sensor and an external ambient magnetic field signal to generate an induced current signal according to a mixed magnetic field signal formed by the excitation magnetic field signals overlapped the ambient magnetic field signal.

304, a frequency-selective amplification is performed.

The induced current signal is processed by the selective amplification to obtain a secondary harmonic signal of the induced current signal.

305, a phase-sensitive detection is performed.

The secondary harmonic signal is processed by the phase-sensitive rectification, and the direct current signal is obtained after the signal reversal.

306, the direct current signal is obtained by a smooth filtering.

The detected direct current signal is processed by the smoothing treatment to eliminate ripples for achieving the final direct current signal.

307, ambient magnetic field data is calculated.

The direct current signal is multiplied by a predetermined calibration coefficient to obtain ambient magnetic field data of each of the fluxgate sensors.

308, a micro-vibration, angle is calculated according to a magnetic field difference.

A micro-vibration data segment in each segment of the ambient magnetic field data is searched out by a wavelet analysis. Micro-vibration data segments in an identical time period in two fluxgate sensors are compared to obtain a magnetic field difference between two micro-vibration data segments, and a micro-vibration angle between two correspondingly fluxgate sensors is obtained by calculating the magnetic field difference.

In order to better understand the disclosure, the following is another embodiment illustrating the magnetic field based micro-vibration measuring method of the disclosure, referring to FIG. 4 and FIG. 5, specifically including following steps.

401, the fluxgate sensors are secured.

The fluxgate sensors and an object to be measured are secured. The fluxgate sensors are separated therebetween.

402, excitation signals are generated.

The excitation signal generating module outputs excitation signals by programming; the excitation signals are square-wave signals.

403, the power of the excitation signals is amplified,

As the power of excitation signals output by the excitation signal generating module is limited, which cannot sufficiently drive the excitation coils. After the excitation signals go through the power amplifying module, the power of the excitation signals is amplified for better driving the excitation coils.

404, the excitation signals are processed by the resonating treatment.

After the power of the excitation signals is amplified and subsequently resonated, the excitation signals send the resonated excitation signals to the excitation coil; the resonating treatment can better guarantee the signal intensity of the excitation signals.

405, the excitation coils generate excitation magnetic field signals.

The excitation signals are transported to the fluxgate sensors. Each of the excitation coils in the fluxgate sensors generates the excitation magnetic field signal according to the received excitation signals.

406, the induction coils generate induced current signals.

The induction coils in the fluxgate sensors receive the excitation magnetic field signals generated by the excitation signals in an identical fluxgate sensor and an external ambient magnetic field signal to generate an induced current signal according to a mixed magnetic field signal formed by the excitation magnetic field signals overlapped the ambient magnetic field signal.

407, the phase-selective amplification is processed.

The induced current signal is processed by the selective amplification to obtain a secondary harmonic signal of the induced current signals.

408, phase-sensitive detection is performed.

The secondary harmonic signal is processed by the phase-sensitive rectification, and the direct current signal is obtained after the signal reversal.

409, the direct current signal is obtained by a smooth filtering.

The detected direct current signal is processed by the smoothing treatment to eliminate ripples for achieving the final direct current signal.

410, the induced current signals are processed by the feedback regulation.

The induced current signals are subtracted from the direct current signal to obtain a signal difference, and magnitude of the induced current signals is processed by a negative feedback regulation according to the signal difference.

The specific procedure of the negative feedback regulation is: judging the signal difference is positive or negative; if the signal difference is negative, the induced current signals are correspondingly increased; if the signal difference is positive, and the induced current signals are correspondingly decreased, until the signal difference is equal to zero. The induced current signals enter 407 after regulation for selectively amplifying.

411, ambient magnetic field data is calculated.

The direct current signal is multiplied by a predetermined calibration coefficient to obtain ambient magnetic field data of each of the fluxgate sensors.

412, a micro-vibration angle is calculated according to a magnetic field difference.

A micro-vibration data segment in each section of the ambient magnetic field data is searched out by a wavelet analysis. The wavelet analysis is varying the ambient magnetic field data by wavelets to obtain a two-dimensional wavelet spectrum. The amplitude with the relatively larger correlation coefficient in the same frequency section in the wavelet spectrum can be default to be the variation of large gradient in the environment, instead of the influence generated by micro-vibration of the vector itself. The position of multiple wavelets with the relatively large variation of amplitudes in, the same frequency section, and comparing two micro-vibration data segments in an identical time period to obtain a magnetic field difference between two micro-vibration data segments. As the magnetic field difference is directional proportional to the micro-vibration angle, the micro-vibration angle between two corresponding fluxgate sensors is consequently obtained by calculating the magnetic field difference.

The specific procedure to calculate the micro-vibration angle is: multiplying the magnetic field difference by a predetermined directly proportional function, and obtaining the micro-vibration angle between two corresponding fluxgate sensors by calculation.

413, the micro-vibration angle is output.

The micro-vibration angle is displayed and output by a display or other devices.

Referring to FIG. 6, the micro-vibration measurement, of a stretch rod or a mast of a satellite will be taken as an example to describe the calculation of the micro-vibration angle.

In an even magnetic field, highly precise fluxgate sensors are mounted on top of the stretch rod. When the stretch rod has a slight variation in angles, three component magnetic field values measured by the fluxgate sensors on top of the stretch rod will be changed accordingly. The varied angle can be obtained by calculating according to the variation of measured value of the magnetic field. When the fluxgate sensors are disposed on different positions of the stretch rod, not only can the interference from the magnetic field of the satellite be eliminated from the magnetic field measurement, but also detecting the deformation of the stretch rod and further correcting the angle variation information.

As $\delta B = B \sin \varphi$

When the background magnetic field intensity $B=2.0\times10^4$ nT, a distance between two measuring points $\delta x=1$ mm, a length of the stretch rod $L=2$ m, an angle of the stretch rod $\sin \varphi \approx 5\times10^{-4}$ the variation of the magnetic field on top of the stretch rod is $\Delta B \approx B \sin \varphi \approx 10$ nT.

The corresponding angle is $\varphi \approx 0.03$.

It can clearly be seen the magnetic field different is directly proportional to the micro-vibration angle.

The magnetic field based micro-vibration measuring method of the disclosure can, specifically be applied in following aspects.

1. The Micro-Vibration Measurement with a Satellite as a Vector

With the development of science and technology as well as national defense military, demands on performances of the satellite such as the high resolution are severe. Various factors can restrict the improvement of satellite resolution. Among them, the influence of micro-vibration caused by removable components of the satellite on sensitive load performances has attracted attention from scholars around the world, which is the motivation for us to research and develop the instrument. The micro-vibration herein refers to the reciprocating motion or oscillation of the satellite with relatively small amplitude caused by the normal operation of rotating parts such as the rotating parts of momentum wheel, stepping parts such as a solar cell array drive mechanism, and swing parts such as camera pendulum, etc. The main characteristics of micro-vibration are small amplitude, wide frequency band and difficulty in control. The displacement produced by micro-vibration is generally in the order of micron magnitude or even smaller, but its harm is significant, especially for high orbit satellites. As far from the earth, micro-vibration may cause huge errors in the observation and seriously affect the imaging quality. Frequency ranges of micro-vibration are from extremely low frequencies to thousands of Hertz and the vibration energy in a range from several hertz to hundreds of Hertz is relatively large, which is uneasy to decay. Due to the small amplitude of the micro-vibration and the complexity of the propagation mechanism in the mechanical structure, the performance of the vibration reduction method relied on the friction energy dissipation decreases, and the micro-vibration measurement is sensitive to the environmental noise which poses a challenge to the attitude control system and makes the control design more complex. Therefore, we design a fluxgate magnetometer based, micro-vibration measurement instrument to measure the micro-vibration, to calibrate the effect of micro-vibration on high precision satellite and satellite attitude control.

2. The Micro-Vibration Measurement with a Slow Mover such as a Vehicle, a Railway, an Airplane, a Ship as a Vector The micro-vibration generated by the vector in driving can be measured in time by mounting a fluxgate magnetometer based micro-vibration measurement device on the vector for providing accurate data to study the influence of the micro-vibration, of vectors on viaducts and skyscrapers calculated by modeling and inversion.

The particular requirement of devices on vectors on micro-vibration is provided with accurate data.

3. The micro-vibration measurement with a static object such as a large precise processing and testing instrument as a vector 3.1 Fault Detect of Bearings When a rolling bearing works, the outer circumference generally is connected with the bearing seat or the cabinet, securely or relatively; the inner ring is connected with the mechanic transmission shaft, rotating with the shaft. In the mechanic operation, as inner factors such as the inherent structural properties of the bearing, errors in processing and assembling, and faults during the operation, when the shaft is run with a certain velocity and load, the vibration system consists of bearing and the bearing seat is incited, and the system is vibrated.

The faults of rolling bearings in operation can be classified into two sorts according to features of vibration signals. One is a surface damage fault, such as pitting, peeling off, abrasion, etc.; the other is called the wear fault.

Regarding the surface damage fault, when the damaged point rolls over the surface of the bearing, a mutated shock pulse occurs. The pulse is a wideband signal, consequently covering each natural frequency of the bearing system and leading to the vibration of the bearing, which is the fundamental feature of vibration signals caused by the damage fault. Meanwhile, the vibration caused by the surface damage fault generally is covered by relatively larger vibration signals, which cannot be distinguished from the power spectrum.

The fluxgate sensor based micro-vibration measurement instrument is used. As the wavelet analysis in data processing has properties of analyzing the signal time-domain and the frequency domain simultaneously, the wavelet analysis technique is employed to modify the detected signals and reform signals with fault features, and the Hilbert transform is used to demodulate and refining the spectrum analysis, and fault composition in the bearing can be detected for judging the position with the fault of the bearing.

3.2 Dependencies Provided to Site Selection for Building a Lab with Precise Instruments Construction of Vibration Isolation Facilities and Fulfillment of Vibration Isolation Technology Precision and ultraprecision instruments have severe requirement on the ambience. Some special precision instruments even require the micro-vibration control level to be less than 1 μg ($10^{-7}$ m/s$^2$). In recent years, along with construction of the urban traffic network, the subway or inter-city railway will inevitably pass by various areas with precision instruments in laboratories, which exacerbates the interference on the environment of the laboratories such as the low SNR of high precision instrument, inaccurate data, reproducibility failure, decreased accuracy, even improper operation and other issues. The ambient vibration (micro-vibration), and electromagnetic interference (optical fiber cable and high voltage cable, etc.) have become the key factors affecting the accuracy of measurement by precision instruments and control on precision. The effect and harm of ambient vibration on usage and research of precision instruments in laboratories of institutes and universities adjacent to the railway or highways in cities have been a hot issue studied and discussed by experts and scholars around the world. All sectors of society and environmental protection departments have aroused great concern thereon. Research on vibration sensitive precise instruments and study on measurement and evaluation methods for ambient vibration can provide technical basis for formulating relevant national calibration standards, and provide support for environmental protection and legislation in national high-tech intensive areas. The fluxgate magnetometer based micro-vibration measurement instrument can well distinguish the ambient vibration, provide the dependence for selecting sites of laboratories with precision instruments, building isolation facilities and fulfilling the isolation technology.

For example, the influence of low-level excitation sources such as vehicle driving on the road can be ignored in general. However, for some special high-rise buildings, the interference of the ambient vibration caused by vehicles is a problem worthy for consideration. When the inner-city train and the heavy vehicle pass by, the vibration of the high buildings increases obviously, which may lead to the increase of the measurement error of some instruments in the building.

The vibration caused by the vehicle is primarily transferred to each floor through the main load-bearing structure of buildings, thus when measuring vibration in each floor, positions near the main load-bearing structure is selected to be measuring spots for placing fluxgate sensors, meanwhile, several spots of different distances with various influences of the vibration from the vehicle on the building are also selected for analysis and comparison.

The description above purely depicts embodiments of the disclosure, rather than any restriction to the disclosure in any manner. Although the disclosure is disclosed, as the embodiments above, the embodiments above cannot limit the disclosure. Any person skilled in the art can achieve equitant embodiments by modifying the aforementioned technical contents within the technical scope of the disclosure. Any contents covered by the disclosure and simple modification and equivalent diversification according to the technical essence of the disclosure should be included in the scope of the disclosure.

What is claimed is:

1. A magnetic field based micro-vibration measurement device comprising:
   a plurality of fluxgate sensors and a control processing circuit
   wherein each of the fluxgate sensors is disposed with an excitation coil and an induction coil that are mutually corresponding;
   wherein the control processing circuit comprises: an excitation signal generating module, a frequency-selective amplifying module, a phase-sensitive rectifying module, a smooth filtering module, an ambient magnetic field acquisition module and a vibration data statistics module;
   wherein the excitation signal generating module is configured for generating an excitation signal;
   wherein the excitation coil of each of the fluxgate sensors is connected to the excitation signal generating module and configured for generating an excitation magnetic field signal according to a received excitation signal;
   wherein the induction coil is configured for receiving a mixed magnetic field signal and generating an induced current signal according to the mixed magnetic field signal, the mixed magnetic field signal is formed by mixing the excitation magnetic field signal generated by the corresponding excitation coil with an external ambient magnetic field signal;
   wherein the frequency-selective amplifying module is connected with the induction coil and configured for performing a frequency-selective amplification on a received induced current signal to obtain a secondary harmonic signal of the induced current signal;
   wherein the phase-sensitive rectifying module is connected with the frequency-selective amplifying module and configured for performing rectification processing and a signal reversal on the secondary harmonic signal;
   wherein the smooth filtering module is connected with the phase-sensitive rectifying module and configured for performing a smooth filtering on the secondary harmonic signal after the signal reversal to obtain a direct current signal;
   wherein the ambient magnetic field acquisition module is connected with the smooth filtering module and configured for multiplying the direct current signal by a predetermined calibration coefficient to obtain ambient magnetic field data;
   wherein the vibration data statistics module is connected with the ambient magnetic field acquisition module and configured for receiving the ambient magnetic field data corresponding to all of the fluxgate sensors, obtaining a micro-vibration data segment in each segment of the ambient magnetic field data by a wavelet analysis, comparing two micro-vibration data segments in a same time period to obtain a magnetic field difference between the two micro-vibration data segments, and calculating a micro-vibration angle between corresponding two of the fluxgate sensors according to the magnetic field difference.

2. The magnetic field based micro-vibration measurement device according to claim 1, wherein the control processing circuit is further disposed with a feedback regulation module, the feedback regulation module is connected with the smooth filtering module and the induction coils individually and configured for subtracting the direct current signal in the smooth filtering module from the induced current signal generated by the induction coil to obtain a signal difference and performing a negative feedback regulation on the induced current signal generated by the induction coil according to the signal difference.

3. The magnetic field based micro-vibration measurement device according to claim 2, wherein a power amplifying module and a resonant module are sequentially connected between the excitation signal generating module and the excitation coils;
   wherein the power amplifying module is connected with the excitation signal generating module and configured for amplifying a power of the excitation signal;
   wherein the resonant module is connected with the power amplifying module and the excitation coils individually and configured for resonating the excitation signal after the power has been amplified and sending the excitation signal after the resonating to the excitation coils.

4. The magnetic field based micro-vibration measurement device according to claim 3, further comprising: a data output module; wherein the data output module is connected with the vibration data statistics module, the data output module is configured for outputting data; the magnetic field based micro-vibration measurement device further comprises a display screen, and the display screen is configured for displaying the micro-vibration angle.

5. The magnetic field based micro-vibration measurement device according to claim 4, wherein the excitation coil comprises two orthonormal coils or three mutual orthonormal coils, and the induction coil comprises three groups of coils.

6. A magnetic field based micro-vibration measuring method comprising:
   generating an excitation signal;
   transmitting the excitation signal to a plurality of fluxgate sensors, and generating excitation magnetic field signals respectively by excitation coils of the fluxgate sensors according, to received excitation signals;
   receiving the excitation magnetic field signal generated by the excitation coil and an external ambient magnetic field signal by an induction coil which is in a same one of the fluxgate sensors as the excitation coil, and generating an induced current signal according to a mixed magnetic field signal formed by the excitation magnetic field signal and the ambient magnetic field signal;
   performing a frequency-selective amplification on the induced current signal to obtain a secondary harmonic signal of the induced current signal;
   performing a rectification processing and a signal reversal on the secondary harmonic signal, and performing smooth filtering after the signal reversal to obtain a direct current signal;
   multiplying the direct current signal by a predetermined calibration coefficient to obtain ambient magnetic field data of each of the fluxgate sensors;

obtaining a micro-vibration data segment in each segment of the ambient magnetic data by a wavelet analysis, comparing micro-vibration data segments in a same time period of two of the fluxgate sensors to obtain a magnetic field difference between two micro-vibration data segments, and calculating a micro-vibration angle between the two of the fluxgate sensors according to the magnetic field difference.

7. The magnetic field based micro-vibration measuring method according to claim 6, after performing a rectification processing and a signal reversal on the secondary harmonic signal, and performing smooth filtering after the signal reversal to obtain a direct current signal, further comprising:

subtracting the direct current signal from the induced current signal to obtain a signal difference, and performing a negative feedback regulation on a magnitude of the induced current signal according to the signal difference.

8. The magnetic field based micro-vibration measuring method according to claim 7, wherein performing a negative feedback regulation on a magnitude of the induced current signal according to the signal, difference comprises:

judging whether the signal difference is positive or negative; and correspondingly increasing the induced current signal if the signal difference is negative, or decreasing the induced current signal if the signal difference is positive until the signal difference is equal to zero.

9. The magnetic field based micro-vibration measuring method according to claim 8, after generating an excitation signal, further comprising:

amplifying a power of the excitation signal,
resonating the excitation signal after amplifying the power, and sending the excitation signal after the resonating to the excitation coils.

10. The magnetic field based micro-vibration measuring method according to claim 9, before generating an excitation signal, further comprising:

securing the fluxgate sensors with an object to-be-measured.

11. The magnetic field based micro-vibration measuring method according to claim 10, after calculating a micro-vibration angle between the two of the fluxgate sensors according to the magnetic field difference, further comprising:

displaying the micro-vibration angle.

12. The magnetic field based micro-vibration measuring method according to claim 11, wherein calculating a micro-vibration angle between the two of the fluxgate sensors according to the magnetic field difference comprises:

multiplying the magnetic field difference by a predetermined direct proportional function to obtain the micro-vibration angle between the two of the fluxgate sensors.

13. The magnetic field based micro-vibration measuring method according to claim 12, wherein the excitation signal is a rectangular wave signal.

14. The magnetic field based micro-vibration measuring method according to claim 13, wherein the fluxgate sensors are spaced apart from each other.

* * * * *